US008251601B2

(12) United States Patent
Huang et al.

(10) Patent No.: US 8,251,601 B2
(45) Date of Patent: Aug. 28, 2012

(54) CAMERA MODULE AND METHOD FOR FABRICATING THE SAME

(75) Inventors: Tzu-Wei Huang, Hsinchu (TW);
Wei-Ping Chen, Taipei County (TW);
Jui-Hung Chang, Hsinchu (TW);
Chia-Hui Huang, Hsinchu (TW);
Teng-Sheng Chen, Hsinche (TW)

(73) Assignees: VisEra Technologies Company Limited, Hsinchu (TW); OmniVision Technologies, Inc., Santa Clara, CA (US)

( * ) Notice: Subject to any disclaimer, the term of this patent is extended or adjusted under 35 U.S.C. 154(b) by 8 days.

(21) Appl. No.: 12/974,720

(22) Filed: Dec. 21, 2010

(65) Prior Publication Data

US 2012/0155854 A1 Jun. 21, 2012

(51) Int. Cl.
*G03B 17/00* (2006.01)

(52) U.S. Cl. ........................................ 396/529; 396/535

(58) Field of Classification Search .............. 396/529, 396/535
See application file for complete search history.

(56) References Cited

U.S. PATENT DOCUMENTS

| 7,964,936 | B2 * | 6/2011 | Shiung et al. ............ 257/659 |
| 2009/0115891 | A1 * | 5/2009 | Ryu et al. .................. 348/374 |
| 2010/0006965 | A1 * | 1/2010 | Shiung et al. ............ 257/432 |
| 2011/0130177 | A1 * | 6/2011 | Halliday .................. 455/575.1 |
| 2011/0304763 | A1 * | 12/2011 | Choi et al. ................ 348/340 |

* cited by examiner

*Primary Examiner* — W. B. Perkey
(74) *Attorney, Agent, or Firm* — Muncy, Geissler, Olds & Lowe, PLLC

(57) ABSTRACT

The invention provides a camera module and a method for fabricating the same. A camera module includes an image sensor device chip having a plurality of solder balls on a bottom surface thereof. An optical lens is disposed on the image sensor device chip. A metal plate has a part that extending over the bottom surface of the image sensor device. A metal coating layer surrounds vertical surfaces of the optical lens and a top surface of the part of the metal plate. A first light shielding layer covers vertical surfaces of the metal coating layer.

20 Claims, 6 Drawing Sheets

CAMERA MODULE AND METHOD FOR FABRICATING THE SAME

BACKGROUND OF THE INVENTION

1. Field of the Invention

The present invention relates to a camera module and a method for fabricating the same, and in particular, to a camera module with an electromagnetic interference (EMI) shielding function using a wafer level packaging process and a method for fabricating the same.

2. Description of the Related Art

The conventional camera module is fabricated by laminating lenses on a substrate having optical devices thereon, and then the substrate laminated with the lenses is diced and divided into several individual camera module units. The conventional camera module is applied in high frequency applications such as RF products, wherein electromagnetic interference (EMI) shielding design is very important.

A novel camera module with an electromagnetic interference (EMI) shielding function and a method for fabricating the same are desired.

BRIEF SUMMARY OF INVENTION

A camera module and a method for fabricating the same are provided. An exemplary embodiment of a camera module comprises an image sensor device chip having a plurality of solder balls on a bottom surface thereof. An optical lens is disposed on the image sensor device chip. A metal plate has a part that extends over the bottom surface of the image sensor device. A metal coating layer surrounds vertical surfaces of the optical lens and a top surface of the part of the metal plate. A first light shielding layer covers vertical surfaces of the metal coating layer.

A method for fabricating a camera module comprises providing a metal plate. An image sensor device chip having a plurality of solder balls is bonded on a bottom surface thereof to the metal plate, wherein the metal plate extends over the bottom surface of the image sensor device. An optical lens is bonded onto the image sensor device chip. An aperture of the optical lens is defined. A metal material is coated. A first light shielding material is coated covering the metal material. The aperture of the optical lens is formed.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
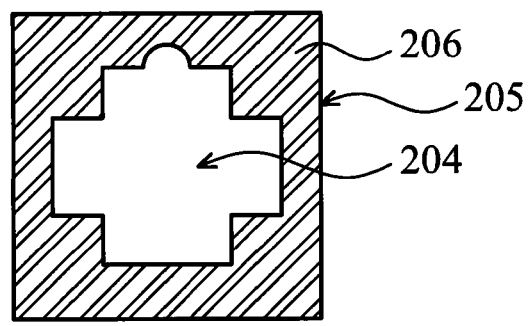
FIGS. 1-9 are cross section views showing one exemplary embodiment of a method for fabricating a camera module with an EMI protection function of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIGS. 1-8 are cross section views showing one exemplary embodiment of a method for fabricating a camera module 500a with an EMI protection function of the invention. Referring to FIG. 1, firstly, a metal plate 206 is provided. In one embodiment, the metal plate 206 may be formed by molding, and the metal plate 206 has a perimeter 205 and an opening 204 passing therethrough. Both shapes of the perimeter and the opening 204 may be varied depending upon the specific design employed. FIG. 1 also illustrates a bottom view of one exemplary embodiment of a metal plate 206. From the bottom view, the metal plate 206 may have the shape of a ring. In one embodiment, the metal plate 206 is used as an electromagnetic interference (EMI) shield portion for a camera module. In one embodiment, the metal plate 206 may comprise Al, Cu or the like (Ag, Iron coating).

Figure 2:
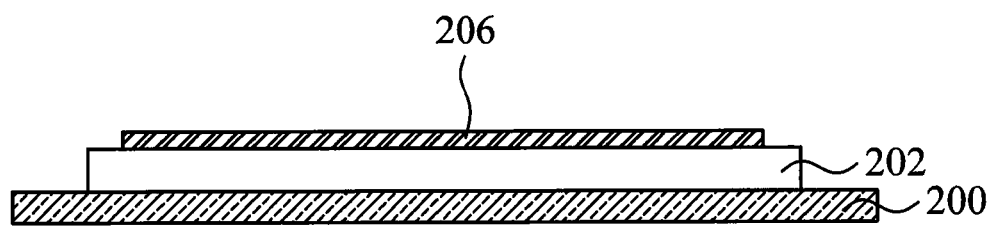

Next, referring to FIG. 2, the metal plate 206 is mounted on the carrier 200 through an adhesive 202. In one embodiment, the carrier 200 may comprise a semiconductor wafer such as a silicon wafer.

Figure 3:
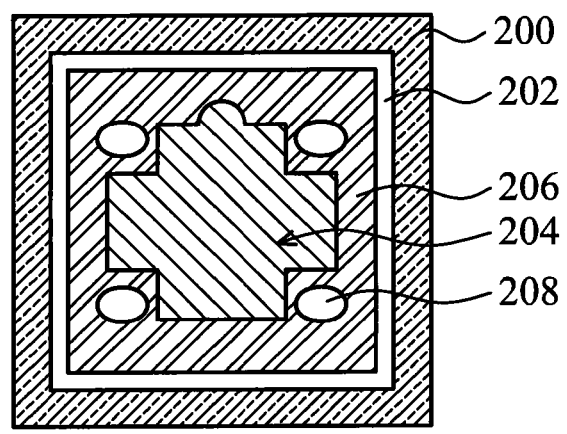
Figure 4:
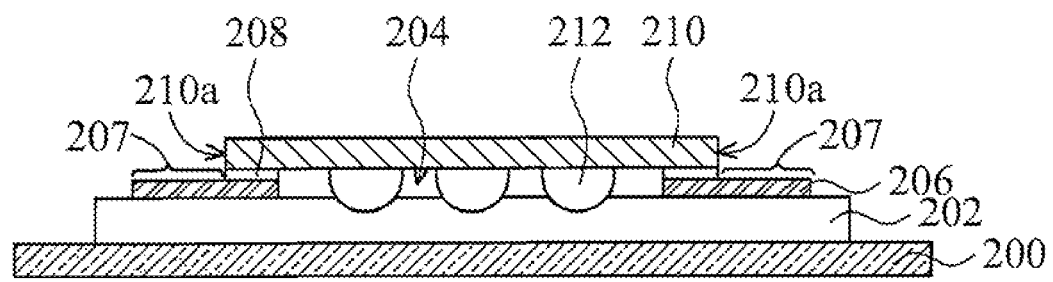

Next, referring to FIG. 3, a dispensing process is performed to apply adhesives 208 to a top surface of the metal plate 206 for bonding of an image sensor device chip 210 as shown in FIG. 4. In one embodiment, the adhesives 208 may comprise resin, epoxy adhesive polymer.

Next, referring to FIG. 4, the image sensor device chip 210 having a plurality of solder balls 212 on a bottom surface. The device chip 210 may bond to the metal plate 206. Because the metal plate 206 may have a larger size than that of the image sensor device chip 210, a top surface of the metal plate 206 overlaps with the bottom surface of the image sensor device chip 210. That is to say, the metal plate 206 has a part 207 that extends over the bottom side of the image sensor device chip 210, such that a portion of the top surface of the metal plate 206 is exposed from the image sensor device chip 210. Also, the metal plate 206 has a function of improving mechanical strength of a camera module made. Therefore, the metal plate 206 may serve as a supporter in a surface mounting technology (SMT) process. As shown in FIG. 4, the metal plate 206 has an opening 204, for facilitation of the solder balls 212 connects to the bonding pads of a printed circuit board. In one embodiment, the solder balls 212 may protrude through the metal plate 206 at the maximum 10 urn. It is noted that a thickness of the metal plate 206 is designed as about 80%-90% of a designate height of the solder balls 212. In one embodiment, the image sensor device chip 210 may comprise complementary metal-oxide-semiconductor (CMOS) devices or charge-coupled devices (CCDs).

Figure 5:
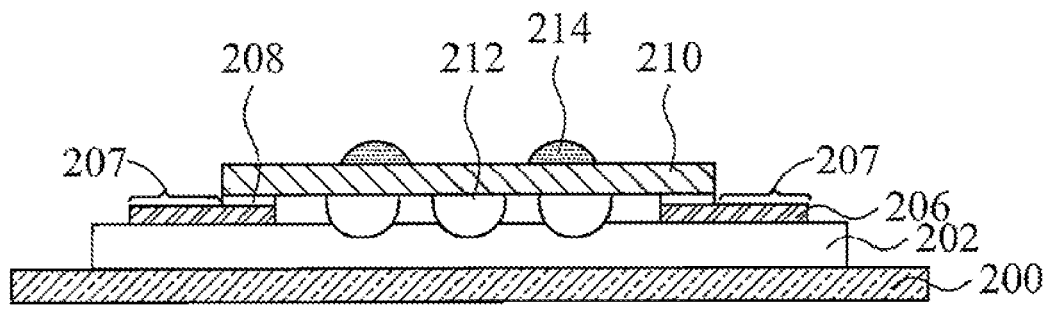
Figure 6:
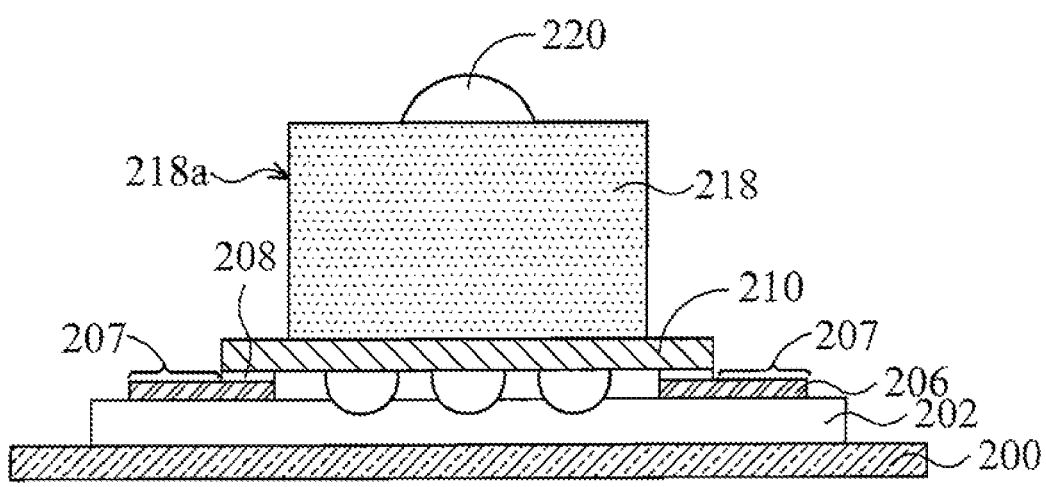

Next, referring to FIG. 5, a dispensing process is performed to apply adhesives 214 to a top surface of the image sensor device chip 210 for bonding of an optical lens 218 as shown in FIG. 6. In one embodiment, the adhesives 214 may comprise resin and acrylic adhesive polymer, and epoxy polymer.

Next, referring to FIG. 6, an optical lens 218 may be bonded onto a top surface of the image sensor device chip 210 by placing the optical lens 218 on the image sensor device chip 210 centrally, wherein the image sensor device chip 210 laterally extends over the optical lens 218 evenly. In one embodiment, the optical lens 218 is formed by a wafer lens process. As shown in FIG. 6, an aperture 220 of the optical lens 218 is located on a top of the optical lens 218.

Figure 7:
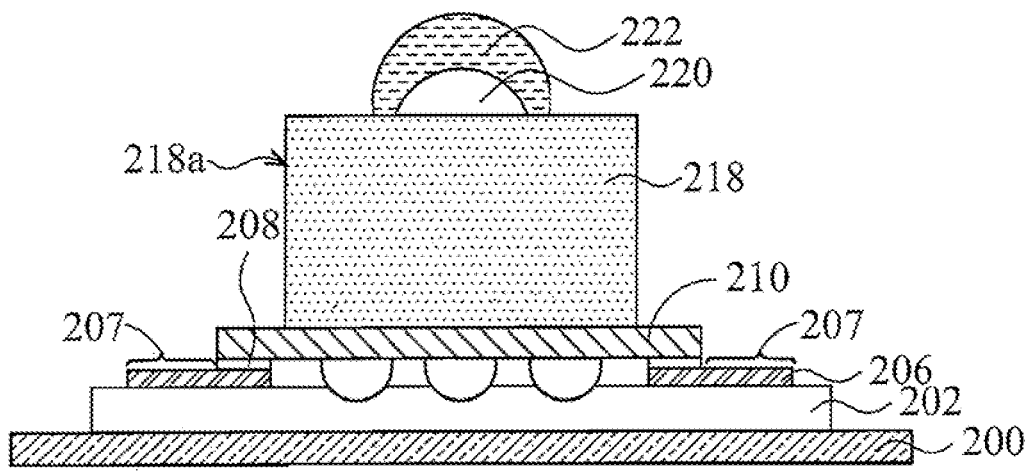

FIG. 7 shows a process step to define the aperture 220 of the optical lens 218. Referring to FIG. 7, next, a mask 222 is formed covering the aperture 220 on the top surface of the optical lens 218. In one embodiment, the mask 222 is used to prevent the aperture 220 from being covered by coating materials applied during subsequent processes. In one embodiment, the mask 222 may comprise polydimethylsiloxane. Next, a curing process may be performed to cure the mask 222, thereby facilitating removal of the mask 222 from the aperture 220 of the lens 218 during subsequent processes.

Figure 8:
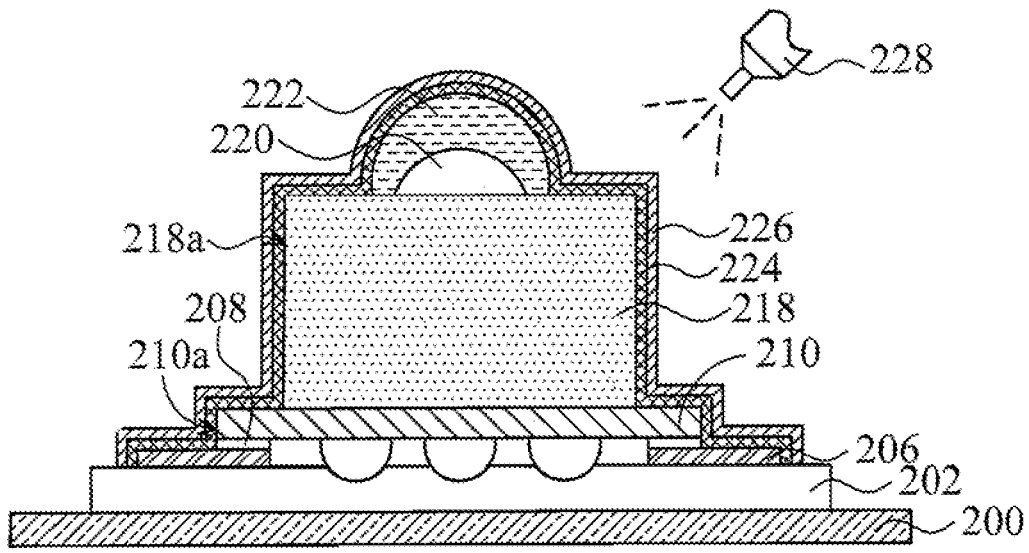

Next, referring to FIG. 8, a coating process 228 is performed to coat a metal material entirely over the mask 222, surrounding vertical surfaces 210a and 218a of the image sensor device chip 210 and the optical lens 218, and surrounding a portion of the metal plate 206 that extends over the bottom surface of the image sensor device chip 210 to form a metal coating layer 224. In one embodiment, the metal coating layer 224 and the metal plate 206 may comprise the same material. Therefore, the metal coating layer 224 and the connecting metal plate 206 in combination may serve as an electromagnetic interference (EMI) shield to provide and electromagnetic interference (EMI) shielding function for the image sensor device chip 210. Next, the coating process 228 is performed to coat a first light shielding material covering the metal coating layer 224 to form a first light shielding layer 226. In one embodiment, the first light shielding layer 226 may comprise a black paint to prevent internal reflections. In one embodiment, the coating process 228 may comprise a spray coating process.

Figure 9:
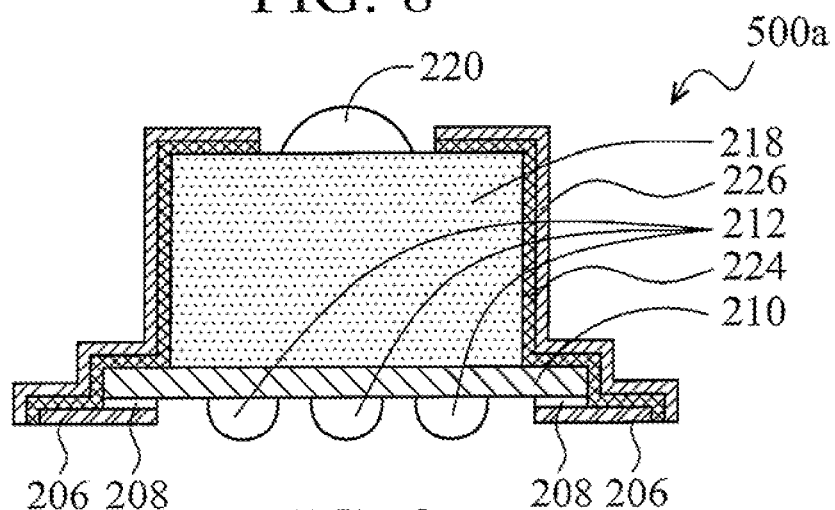
Figure 10:
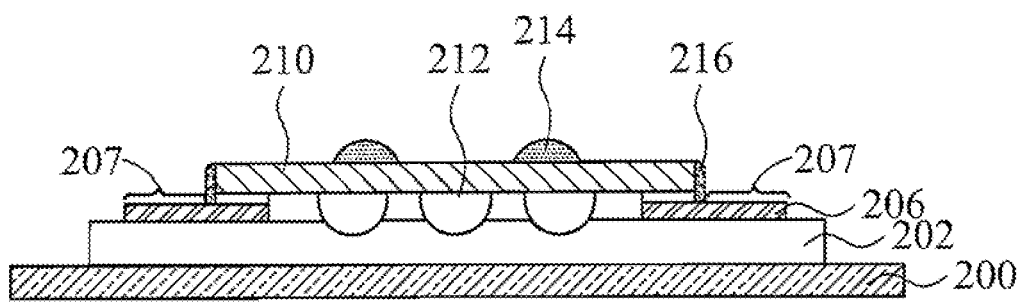
FIGS. 10-14 are cross section views showing another exemplary embodiment of a method for fabricating a camera module with an EMI protection function of the invention.

Next, referring to FIG. 9, a laser cutting process is performed to cut the metal coating layer 224 and the first light shielding layer 226 adjacent to an boundary of the mask 222. Next, a de-masking process is performed to remove the mask 222 and a portion of the metal coating layer 224 and the first light shielding layer 226 over the mask 222 as shown in FIG. 8. After the de-masking process, the metal coating layer 224 and the first light shielding layer 226 partially surround the top surface of the optical lens 218 As shown in FIG. 9, the metal plate 206 and the metal coating layer 224, in connection with each other, shields the camera module except for the solder balls 212 and the aperture 220 of the optical lens 218. Also, the first light shielding layer 226 covers vertical surfaces of the metal coating layer 224. Therefore, completing the description of fabrication of one exemplary embodiment of a camera module 500a of the invention. The camera module 500a comprises an image sensor device chip 210 having a plurality of solder balls 212 on a bottom surface thereof. An optical lens 218 is disposed on the image sensor device chip 210. A metal plate 206 having a part that extends over the bottom surface of the image sensor device 210. A metal coating layer 224 surrounds vertical surfaces 218a of the optical lens, and the metal coating layer 224 surrounds a top surface of the part of the metal plate 206. A first light shielding layer 226 covers vertical surfaces of the metal coating layer 224.

Figure 15:
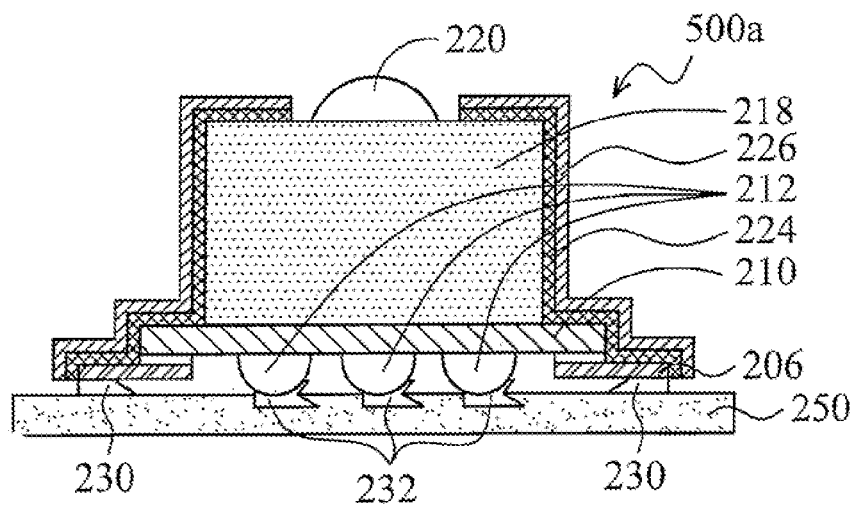
FIGS. 15-17 are cross section views of exemplary embodiments of a camera module with an EMI protection function of the invention.

FIG. 15 illustrates one exemplary embodiment of a camera module 500a with an EMI protection function bonding onto a printed circuit board 250 by a re-flow process, showing an electrical connection between the camera module 500a and the printed circuit board 250. As shown in FIG. 15, the solder balls 212 of the image sensor device chip 210 electrically connect to bonding pads of the printed circuit board 250 for signal transmission. Also, the metal plate 206 of the camera module 500a electrically connects to ground pads of the printed circuit board 250 for an electromagnetic interference (EMI) shielding function.

FIGS. 10-14 are cross section views showing another exemplary embodiment of a method for fabricating a camera module 500b with an EMI protection function of the invention. Elements of the embodiments hereinafter, that are the same or similar as those previously described with reference to FIGS. 1-8 and 14, are not repeated for brevity. Referring to FIG. 9, the image sensor device chip 210 is bonded to the metal plate 206, a dispensing process is performed to respectively apply adhesives 214 to a top surface of the image sensor device chip 210. During the dispensing process, an insulating material is dispensed to cover the vertical surfaces of the image sensor device chip 210 to form an insulating layer 216. In one embodiment, the insulating layer 216 may comprise acrylic adhesive polymer, epoxy adhesive polymer.

Figure 11:
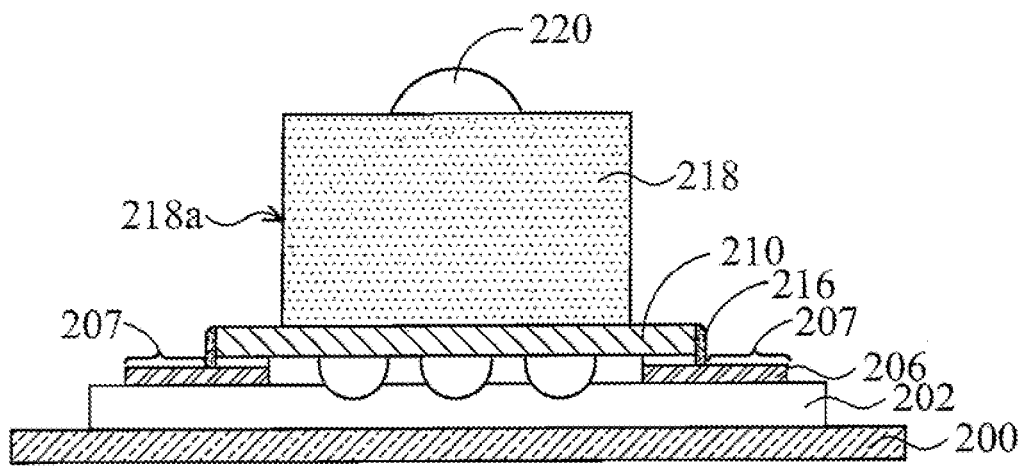

Next, referring to FIG. 11, an optical lens 218 may be bonded onto a top surface of the image sensor device chip 210 by placing the optical lens 218 on the image sensor device chip 210 centrally, wherein the image sensor device chip 210 laterally extends over the optical lens 218 evenly. In one embodiment, the optical lens 218 is formed by a wafer lens process. As shown in FIG. 11, an aperture 220 of the optical lens 218 is located on a top of the optical lens 218.

Figure 12:
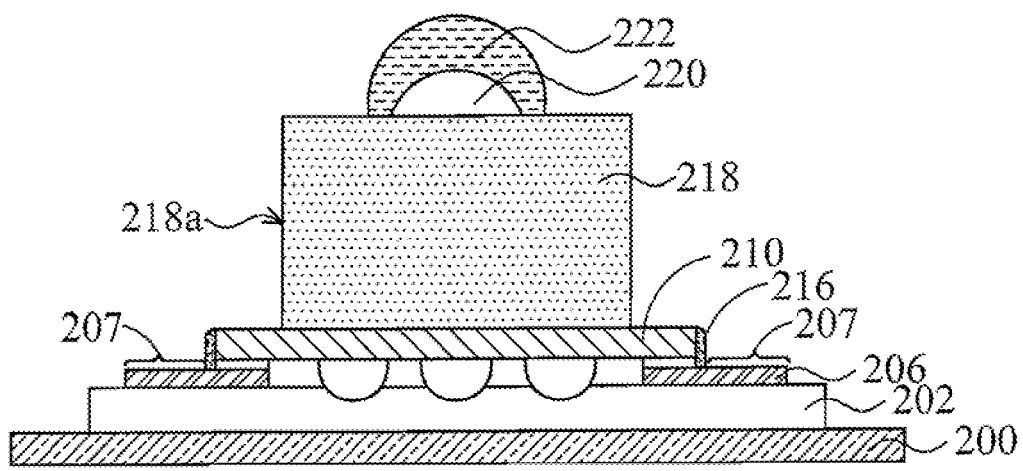

FIG. 12 shows a process step to define the aperture 220 of the optical lens 218. Referring to FIG. 12, next, a mask 222 is formed covering the aperture 220 on the top surface of the optical lens 218. In one embodiment, the mask 222 is used to prevent the aperture 220 from being covered by coating materials applied during subsequent processes. In one embodiment, the mask 222 may comprise polydimethylsiloxane. Next, a curing process may be performed to cure the mask 222, thereby facilitating removal of the mask 222 from the aperture 220 of the lens 218 during subsequent processes.

Figure 13:
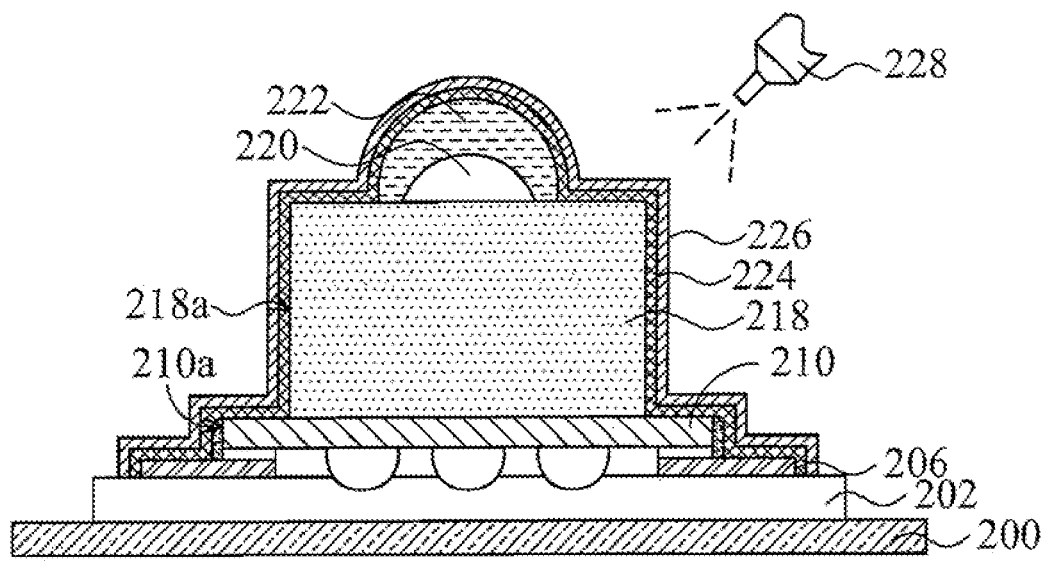

Next, referring to FIG. 13, a coating process 228 is performed to coat a metal material entirely over the mask 222, surrounding vertical surfaces 210a of the image sensor device chip 210, vertical surfaces 218a of the optical lens 218 and vertical surfaces of the insulating layer 216. The metal material also surrounds a portion of the metal plate 206 that extends over the bottom surface of the image sensor device chip 210 to form a metal coating layer 224. In one embodiment, the metal coating layer 224 and the metal plate 206 may comprise the same material. Therefore, the metal coating layer 224 and the connecting metal plate 206 in combination may serve as an electromagnetic interference (EMI) shield to provide and electromagnetic interference (EMI) shielding function for the image sensor device chip 210. As shown in FIG. 13, the insulating layer 216 provides sidewall isolation of the image sensor device chip 210 to the metal coating layer 224. Next, the coating process 228 is performed to coat a first light shielding material covering the metal coating layer 224 to form a first light shielding layer 226. In one embodiment, the first light shielding layer 226 may comprise a black paint to prevent internal reflections. In one embodiment, the coating process 228 may comprise a spray coating process.

Figure 14:
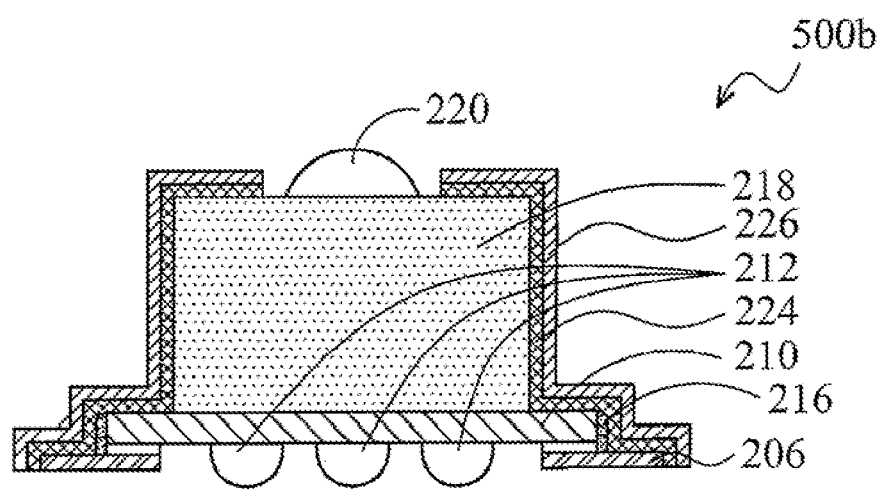

Next, referring to FIG. 14, a laser cutting process is performed to cut the metal coating layer 224 and the first light shielding layer 226 adjacent to an boundary of the mask 222.

Next, a de-masking process is performed to remove the mask 222 and a portion of the metal coating layer 224 and the first light shielding layer 226 over the mask 222 as shown in FIG. 13. After the de-masking process, the metal coating layer 224 and the first light shielding layer 226 partially surround the top surface of the optical lens 218 As shown in FIG. 14, the metal plate 206 and the metal coating layer 224, in connection with each other, shields the camera module except for the solder balls 212 and the aperture 220 of the optical lens 218. Also, the first light shielding layer 226 covers vertical surfaces of the metal coating layer 224. Therefore, completing the description of fabrication of one exemplary embodiment of a camera module 500b of the invention. The camera module 500b comprises an image sensor device chip 210 having a plurality of solder balls 212 on a bottom surface thereof. An optical lens 218 is disposed on the image sensor device chip 210. A metal plate 206 having a part that extends over the bottom surface of the image sensor device 210. A metal coating layer 224 surrounds vertical surfaces 218a of the optical lens, and the metal coating layer 224 surrounds a top surface of the part of the metal plate 206. A first light shielding layer 226 covers vertical surfaces of the metal coating layer 224 The camera module 500b further comprise an insulating layer 216 between the image sensor device chip 210 and the metal coating layer 224, covering the vertical surfaces 210a of the image sensor device chip 210.

Figure 16:
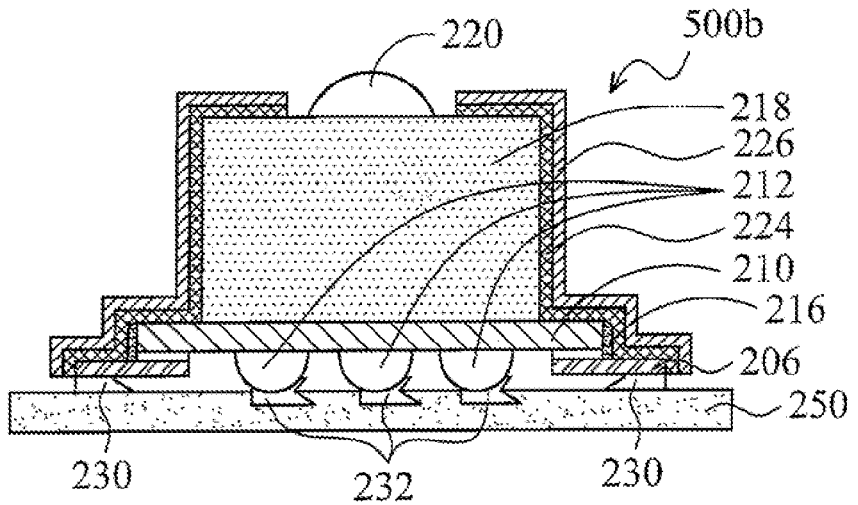

FIG. 16 illustrates another exemplary embodiment of a camera module 500b with an EMI protection function bonded onto a printed circuit board 250 by a re-flow process of the invention, showing an electrical connection between the camera module 500b and the printed circuit board 250. Similar to FIG. 15, the solder balls 212 of the image sensor device chip 210 as shown in FIG. 16, electrically connect to bonding pads of the printed circuit board 250 for signal transmission. Also, the metal plate 206 of the camera module 500b electrically connects to ground pads of the printed circuit board 250 for an electromagnetic interference (EMI) shielding function.

Figure 17:
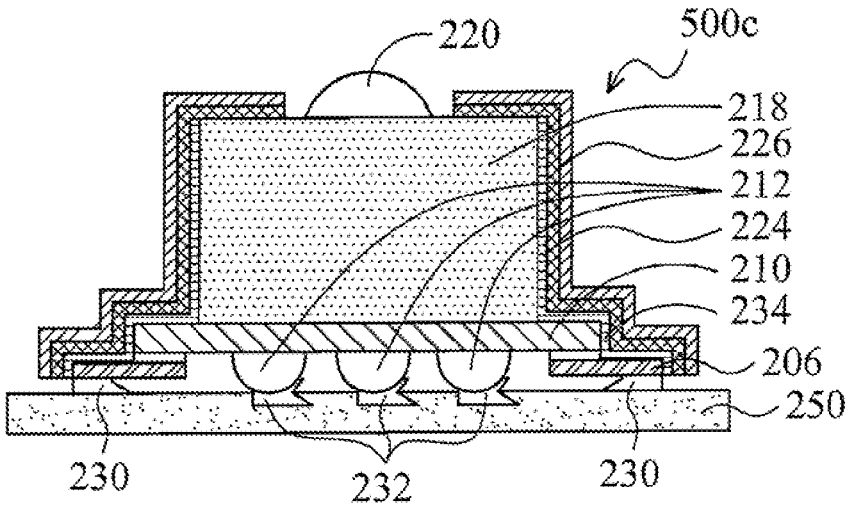

FIG. 17 illustrates yet another exemplary embodiment of a camera module 500c with an EMI protection function bonded onto a printed circuit board 250 by a re-flow process, showing an electrical connection between the camera module 500b and the printed circuit board 250. For further light shielding efficiency, a coating process may be performed to coat a second light shielding material over the vertical surfaces 210a and 218a of the image sensor device chip 210 and the optical lens 218 and covering the top surface of the part of the metal plate 206 to form a second light shielding layer 234 before forming the metal coating layer 222. In one embodiment, the first light shielding layer 226 and the second light shielding layer 234 may comprise the same material, for example, a black paint. Similar to FIG. 15, the solder balls 212 of the image sensor device chip 210 as shown in FIG. 17, electrically connect to bonding pads of the printed circuit board 250 for signal transmission. Also, the metal plate 206 of the camera module 500c electrically connects to ground pads of the printed circuit board 250 for an electromagnetic interference (EMI) shielding function.

Exemplary embodiments of a camera module and methods for fabricating a camera module are provided. The camera module comprises a metal plate and a metal coating connected to each other to shield the camera module, with the exception of the solder balls of the image sensor device chip and an aperture of a lens, and the metal plate is electrically connected to ground pad of a printed circuit board. Therefore, the camera module has an electromagnetic interference (EMI) shielding function. Additionally, the metal plate may not only serve as an (analogous) ground pin, but also serve as a supporter, with an improved mechanical strength, for a surface mounting technology (SMT) process. Further, the camera module may be bonded onto a printed circuit board by a re-flow process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A camera module, comprising:
   an image sensor device chip having a plurality of solder balls on a bottom surface thereof;
   an optical lens disposed on the image sensor device chip;
   a metal plate having a part that extends over the bottom surface of the image sensor device;
   a metal coating layer surrounding vertical surfaces of the optical lens and a top surface of the part of the metal plate; and
   a first light shielding layer covering vertical surfaces of the metal coating layer.

2. The camera module as claimed in claim 1, further comprising an insulating layer between the image sensor device chip and the metal coating layer, covering the vertical surfaces of the image sensor device chip.

3. The camera module as claimed in claim 1, further comprising a second light shielding layer between the image sensor device chip and the metal coating layer, covering the vertical surfaces of the optical lens and the top surface of the part of the metal plate.

4. The camera module as claimed in claim 1, wherein the image sensor device chip laterally extends over the optical lens.

5. The camera module as claimed in claim 1, wherein the metal plate connects to ground pads of a printed circuit board.

6. The camera module as claimed in claim 1, wherein the metal coating layer and the first light shielding layer partially surround a top surface of the optical lens.

7. The camera module as claimed in claim 3, wherein the first light shielding layer or the second light shielding layer comprises black paint.

8. The camera module as claimed in claim 1, wherein the metal plate has an opening and some of the plurality of solder balls protrude through the opening at a distance.

9. The camera module as claimed in claim 8, wherein the distance that is less than 10 um.

10. The camera module as claimed in claim 1, wherein the metal plate has a thickness is varied within a range of a design height of the plurality of solder balls.

11. The camera module as claimed in claim 10, wherein the range is between 80% and 90%.

12. A method for fabricating a camera module, comprising:
    providing a metal plate;
    bonding an image sensor device chip having a plurality of solder balls on a bottom surface thereof to the metal plate, wherein the metal plate extends over the bottom surface of the image sensor device;
    bonding an optical lens onto the image sensor device chip;
    defining an aperture of the optical lens;
    coating a metal material covering the optical lens and the metal plate;
    coating a first light shielding material covering the metal material; and
    forming the aperture of the optical lens.

13. The method for fabricating a camera module as claimed in claim 12, wherein defining an aperture of the optical lens comprising:

forming a mask covering the aperture of the optical lens before the coating a metal material covering the optical lens and the metal plate; and curing the mask.

14. The method for fabricating a camera module as claimed in claim 12, further comprising dispensing an insulating material to cover vertical surfaces of the image sensor device chip.

15. The method for fabricating a camera module as claimed in claim 12, further comprising coating a second light shielding material before coating the metal material covering the optical lens and the metal plate.

16. The method for fabricating a camera module as claimed in claim 13, wherein coating the metal material covering the optical lens and the metal plate comprises forming a metal layer surrounding vertical surfaces of the optical lens and a portion of the metal plate that extends over the bottom surface of the image sensor device.

17. The method for fabricating a camera module as claimed in claim 12, wherein forming the aperture of the optical lens comprising:

applying a laser cutting process; and removing the mask and a portion of the metal material and the first light shielding layer over the mask.

18. The method for fabricating a camera module as claimed in claim 12, wherein providing the metal plate comprises molding the metal plate.

19. The method for fabricating a camera module as claimed in claim 12, wherein bonding the optical lens onto the image sensor device chip comprising:

applying an adhesive; and placing the optical lens on the image sensor device chip centrally, wherein the image sensor device chip laterally extends over the optical lens evenly.

20. The method for fabricating a camera module as claimed in claim 12, further comprising connecting the metal plate to ground pads of a printed circuit board.

* * * * *